(12) United States Patent
Nishizawa

(10) Patent No.: US 10,991,650 B2
(45) Date of Patent: Apr. 27, 2021

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventor: Tatsuo Nishizawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/262,336

(22) Filed: Jan. 30, 2019

(65) Prior Publication Data

US 2019/0273041 A1   Sep. 5, 2019

(30) Foreign Application Priority Data

Mar. 2, 2018   (JP) .............................. JP2018-037994

(51) Int. Cl.
| | |
|---|---|
| *H01L 23/50* | (2006.01) |
| *H01L 23/498* | (2006.01) |
| *H01L 21/56* | (2006.01) |
| *H01L 23/31* | (2006.01) |
| *H01L 23/492* | (2006.01) |
| *H01L 25/07* | (2006.01) |
| *H01L 23/373* | (2006.01) |

(52) U.S. Cl.
CPC ............ *H01L 23/50* (2013.01); *H01L 21/565* (2013.01); *H01L 23/3107* (2013.01); *H01L 23/492* (2013.01); *H01L 25/072* (2013.01); *H01L 23/3121* (2013.01); *H01L 23/3735* (2013.01)

(58) Field of Classification Search
CPC . H01L 23/49811; H01L 23/50; H01L 23/492; H01L 21/565
See application file for complete search history.

(56) References Cited

U.S. PATENT DOCUMENTS

| | | | | | |
|---|---|---|---|---|---|
| 5,869,890 | A | * | 2/1999 | Nishiura | ............. H01L 21/4807 257/705 |
| 8,617,455 | B2 | * | 12/2013 | Mazumder | .............. C30B 29/20 264/630 |
| 8,854,820 | B2 | * | 10/2014 | Yamamoto | ......... H05K 7/20154 361/715 |
| 9,559,042 | B2 | * | 1/2017 | Nakamura | .............. H01L 25/18 |
| 9,617,455 | B2 | * | 4/2017 | Higashidate | ........... C09J 183/04 |
| 2001/0028108 | A1 | * | 10/2001 | Higashi | ................. H01L 21/563 257/735 |
| 2012/0241953 | A1 | * | 9/2012 | Yamada | .............. H01L 23/4334 257/737 |

(Continued)

FOREIGN PATENT DOCUMENTS

WO   WO-2015/151235 A1   10/2015

*Primary Examiner* — Khaja Ahmad
*Assistant Examiner* — Khatib A Rahman
(74) *Attorney, Agent, or Firm* — Rabin & Berdo, P.C.

(57) ABSTRACT

A semiconductor device includes a conductive plate to which a semiconductor element is mounted on a front surface; a sealing resin internally encapsulating at least the front surface of the conductive plate and the semiconductor element; and an external connection terminal connected to the conductive plate and exposed outside the sealing resin. The external connection terminal has a buckling portion or an expanding and contracting portion. The external connection terminal may have a notch and the buckling portion is a part having the notch.

6 Claims, 17 Drawing Sheets

(56) References Cited

U.S. PATENT DOCUMENTS

| | | |
|---|---|---|
| 2014/0374889 A1* | 12/2014 | Denta ............... H01L 23/49517 |
| | | 257/666 |
| 2016/0233146 A1 | 8/2016 | Nakamura |
| 2019/0295932 A1* | 9/2019 | Nakata .................... H01L 23/48 |
| 2020/0052420 A1* | 2/2020 | Mitsumoto ........... H01L 23/049 |
| 2020/0098701 A1* | 3/2020 | Harada ............. H01L 23/49568 |
| 2020/0234905 A1* | 7/2020 | Shirakata ............... H01H 85/38 |

\* cited by examiner

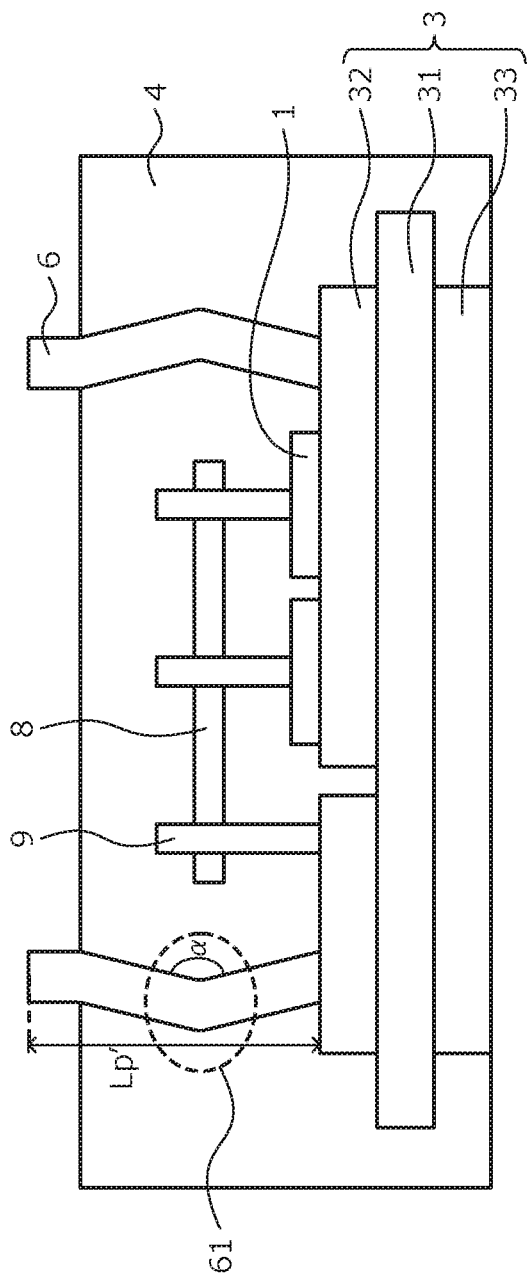

|  | YOUNG'S MODULUS (GPa) | CTE (×10⁻⁶/K) |
|---|---|---|
| Pb-5Sn | 18.4 | 29.4 |
| Pb-63Sn | 27.3 | 23.5 |
| Sn-57Bi-1Ag | 25.3 | 17.5 |
| Sn-0.75Cu | 34.0 | 22.6 |
| Sn-0.3Ag-0.7Cu | 37.5 | 21.8 |
| Sn-3Ag-0.5Cu | 41.6 | 21.7 |
| Sn-5Sb | 45.4 | 22.8 |
| Sn | 53.0 | 22.3 |

FIG.18

|  | THERMAL CONDUCTIVITY (W/mK) | BENDING STRENGTH (MPa) | CTE ($\times 10^{-6}$/K) |
|---|---|---|---|
| $Al_2O_3$ | 20 | 500 | 7.0 |
| $Si_3N_4$ | 80 | 700 | 3.4 |
| AlN | 170 | 450 | 4.6 |

# SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2018-037994, filed on Mar. 2, 2018, the entire contents of which are incorporated herein by reference.

BACKGROUND OF THE INVENTION

1. Field of the Invention

Embodiments of the invention relate to a semiconductor device and a method of manufacturing a semiconductor device.

2. Description of Related Art

Recently, with a focus on insulated gate bipolar transistors (IGBTs), power semiconductor modules are widely used in power converting equipment. A power semiconductor module is a power semiconductor device that has one or more built-in power semiconductor chips and that constitutes entirely or a part of a conversion connection.

Trends of power semiconductor modules include thinner, smaller sizes and larger current capacities. Accordingly, a molded power semiconductor module exists that has no terminal case or cover. FIG. 17 is a side view of a structure of a power semiconductor module having a conventional molded structure. The power semiconductor module includes a power semiconductor chip 101, a bonding member 102, a stacked substrate 103, a sealing insulation material 104, an external connection terminal 106, an internal circuit board 108, and an implant pin 109. The power semiconductor chip 101 is a power semiconductor chip for an IGBT or diode, etc., and is mounted on a conductive plate via the bonding member 102 of the stacked substrate 103. The stacked substrate 103 includes a conductive plate made of copper or the like on a front surface of an insulating substrate such as a ceramic substrate and a heat dissipating plate made of copper or the like on a rear surface. The external connection terminal 106 is fixed on the stacked substrate 103 and protrudes externally from the sealing insulation material 104. The implant pin 109 electrically connects the power semiconductor chip 101 and the internal circuit board 108, via the bonding member 102. The implant pin 109 also electrically connects the internal circuit board 108 and the conductive plate, via the bonding member 102. The sealing insulation material 104 seals the power semiconductor chip 101 and the conductive plate of the stacked substrate 103. Refer to International Publication No. WO 2015/151235 for an example.

SUMMARY OF THE INVENTION

According to an embodiment of the present invention, a semiconductor device includes a conductive plate to which a semiconductor element is mounted on a front surface; a sealing resin internally encapsulating at least the front surface of the conductive plate and the semiconductor element; and an external connection terminal connected to the conductive plate and exposed outside the sealing resin. The external connection terminal has a buckling part or an expanding and contracting part.

In the embodiment, the external connection terminal has a notch. The buckling part is a part of the external connection terminal, the part having the notch.

In the embodiment, in the external connection terminal, an angle of the buckling part is in a range from 120 degrees to 177 degrees.

In the embodiment, the external connection terminal includes a terminal externally exposed and the expanding and contracting part. The expanding and contracting part is a bonding member provided between the conductive plate and the terminal.

In the embodiment, the external connection terminal includes a lower conductive plate, an upper conductive plate, a terminal connecting the lower conductive plate and the upper conductive plate, and the expanding and contracting part. The expanding and contracting part is a bonding member provided between the conductive plate and the lower conductive plate.

In the embodiment, the lower conductive plate has a hollow structure. The buckling part of the terminal is provided in the hollow structure.

In the embodiment, the external connection terminal includes a lower conductive plate, an upper conductive plate, and the expanding and contracting part. The expanding and contracting part is a bonding member provided between the conductive plate and the lower conductive plate, and between the upper conductive plate and the lower conductive plate.

In the embodiment, the semiconductor device includes an internal circuit board to which a first end of an implant pin is press-fit, the implant pin having a second end bonded to the semiconductor element. The internal circuit board is connected to the bonding member.

In the embodiment, the external connection terminal includes an upper conductive plate and the expanding and contracting part. The expanding and contracting part is a bonding member provided between the conductive plate and the upper conductive plate.

In the embodiment, the external connection terminal includes an upper conductive plate, a terminal connecting the conductive plate and the upper conductive plate, and the expanding and contracting part. The expanding and contracting part is a bonding member provided between the conductive plate and the terminal.

In the embodiment, the external connection terminal includes a lower conductive plate, the expanding and contracting part, and a terminal externally exposed. The expanding and contracting part is a bonding member provided between the lower conductive plate and the conductive plate.

In the embodiment, the expanding and contracting part is a bonding member provided between the conductive plate and the terminal, and between the upper conductive plate and the terminal.

In the embodiment, the expanding and contracting part is a bonding member provided between the lower conductive plate and the conductive plate, and between the lower conductive plate and the terminal.

In the embodiment, the external connection terminal applies pressure to the conductive plate, the pressure is less than 80% of a bending strength of the conductive plate.

In the embodiment, the bonding member is solder.

In the embodiment, a load applied to the bonding member is less than 90% of a bending strength of the conductive plate.

According to an embodiment of the present invention, a method of manufacturing a semiconductor device, includes erectly providing an external connection terminal on a conductive plate to which a semiconductor element is mounted on a front surface, the external connection terminal being connected to the semiconductor element; inserting the conductive plate in a mold; applying pressure to the mold, and buckling or compressing the external connection terminal; and injecting sealing resin in the mold, and encapsulating at least the semiconductor element and the front surface of the conductive plate inside.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 1 is a side view of a structure of a power semiconductor module according to a first embodiment;

FIG. 18 is a table of characteristics of various types of ceramics.

DETAILED DESCRIPTION OF THE INVENTION

Figure 2A:
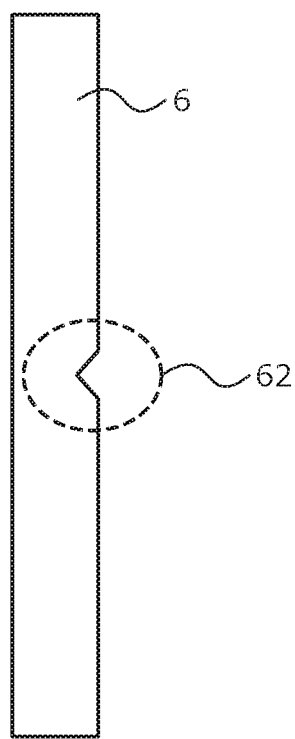
FIG. 2A is a cross-section view depicting an example of an external connection terminal of the power semiconductor module according to the first embodiment.

First, problems associated with the related technologies will be discussed. Conventionally, a ceramic is used in the insulating substrate. Ceramics have high thermal conductivity and thus, facilitate external dissipation of heat generated by the power semiconductor chip 101. Further, thermal expansion is about equal for the power semiconductor chip 101 and the sealing insulation material 104. Thus, there are advantages including low thermal stress during heat cycle testing, suppression of module warping, and reduced likelihood of peeling of the sealing insulation material 104 and the stacked substrate 103. Nonetheless, ceramics have low bending strength and therefore, when the insulating substrate is damaged by stress of a small magnitude, for example, a crack and/or break may occur. For example, when a molded power semiconductor module is fabricated, i.e., manufactured, the mold places stress on the external connection terminal and this stress may cause cracks in the insulating substrate and/or cause the insulating substrate to break. In this case, a problem arises in that insulating properties of the insulating substrate degrade, reducing reliability of the power semiconductor module.

Embodiments of a semiconductor device and a method of manufacturing a semiconductor device according to the present invention will be described in detail with reference to the accompanying drawings. The inventors, as a result of earnest research, found that by providing a buckling part (buckling portion) or an expanding and contracting part (expanding and contracting portion) in the external connection terminal, the stress applied to the insulating substrate is reduced, enabling damage of the insulating substrate to be prevented.

FIG. 1 is a side view of a structure of a power semiconductor module according to a first embodiment. In the power semiconductor module, on an insulating substrate 31 having opposite surfaces that are a front surface and a rear surface, respectively, a conductive plate 32 made of copper or the like is disposed on the front surface and a heat dissipating plate 33 made of copper or the like is disposed on the rear surface, thereby constituting a stacked substrate 3. At a front surface of the conductive plate 32 of the stacked substrate 3, plural power semiconductor chips 1 are mounted via a non-depicted bonding member. Further, at front surfaces of the power semiconductor chips 1, an internal circuit board 8 is connected via implant pins 9, and from the internal circuit board 8, via another implant pin 9, the conductive plate 32 of the stacked substrate 3 is connected. Surfaces of these members are covered by the sealing insulation material 4.

The power semiconductor chips 1 are made of a material such as silicon (Si), silicon carbide (SiC), or gallium nitride (GaN). The power semiconductor chips 1 include a switching element such as an IGBT, a power metal oxide semiconductor field effect transistor (MOSFET), etc. These power semiconductor chips 1, for example, each includes a drain electrode or a collector electrode at a rear surface, and a gate electrode and a source electrode or an emitter electrode at the front surface.

Further, as necessary, the power semiconductor chips 1 include a diode such as a Schottky barrier diode (SBD), a free wheeling diode (FWD), etc. These power semiconductor chips 1 each include a cathode electrode at the rear surface and an anode electrode at the front surface. In the power semiconductor chips 1 above, the electrodes on the rear surfaces are bonded to the front surface of a predetermined conductive plate 32 by a non-depicted bonding member.

The stacked substrate 3 includes the insulating substrate 31, the heat dissipating plate 33 formed at the rear surface of the insulating substrate 31, and the conductive plate 32 formed at the front surface of the insulating substrate 31. The insulating substrate 31 is made of a ceramic having high thermal conductivity such as that containing aluminum oxide, aluminum nitride, silicon nitride, etc. having good thermal conductivity. The heat dissipating plate 33 is made of a metal having good thermal conductivity such as copper, aluminum, iron, silver, or an alloy containing at least one of these metals. The conductive plate 32 is made of a metal having good conductivity such as copper, aluminum, or an alloy containing at least one of these metals. As the stacked substrate 3 having this configuration, for example, a direct copper bonding (DCB) substrate or an active metal blazed (AMB) substrate may be used. The stacked substrate 3 may conduct heat generated by the power semiconductor chips 1 to outside the semiconductor device, via the conductive plate 32, the insulating substrate 31, and the heat dissipating plate 33.

For the sealing insulation material 4, a thermosetting resin or a thermoplastic resin may be used and the sealing insulation material 4 may further contain an adhesive aid. Further, according to purpose, for example, a microfiller or a nanofiller containing inorganic particles such as silica, aluminum oxide, boron nitride, aluminum nitride, etc. may be included as an inorganic filler.

As the bonding member solder, a conductive adhesive, a sintered metal such as silver (Ag), copper (Cu) nanoparticles, etc. may be used.

An external connection terminal 6 is bonded at a predetermined site on the conductive plate 32 configuring a circuit pattern of the stacked substrate 3. Further, the plural power semiconductor chips 1 are bonded to the conductive plate 32, via the bonding member. Above the power semiconductor chips 1, the internal circuit board 8 is disposed, and the implant pins 9, via the bonding member, bond the power semiconductor chips 1 and the internal circuit board 8 as well as the internal circuit board 8 and the conductive plate 32.

The internal circuit board 8 is formed by bonding to an insulating substrate made of a ceramic or a resin, a metal layer constituting wiring. The metal layer may be any one of a single-sided, double-sided, or multilayer structure. The internal circuit board 8 is constituted by the stacked substrate, and the implant pins 9 inserted in via holes formed penetrating the metal layer and the insulating substrate of the stacked substrate. At an inner surface of the via hole, a metal layer that is conductively coupled to the metal layer of the wiring is formed and this metal layer at the inner surface is conductively coupled to the implant pin 9. The implant pin 9 is made of a metal having low electrical resistance and good thermal conductivity such as copper, aluminum, iron, silver, or an alloy containing at least one of these metals. Further, for corrosion resistance and solderability, the implant pin 9 may have at a surface, for example, a nickel or tin plating film.

The external connection terminal 6 is made of a metal having low electrical resistance and good thermal conductivity such as copper, aluminum, iron, silver, or an alloy containing at least one of these metals. The external connection terminal 6 may be made of oxygen-free copper, tough-pitch copper, phosphorus deoxidized copper, phosphor bronze. Further, for corrosion resistance and solderability, a nickel or tin plating film may be formed. Further, the external connection terminal 6, as depicted in FIG. 1, has a buckling portion 61. Buckling is when an axial compression load applied to a rod-shaped member like the external connection terminal 6 is gradually increased and a sudden bending-type deformation occurs at a certain load, thereby causing a large deflection transversely. The buckling portion 61 is a part where a bent deformation occurs due to such buckling. The buckling portion 61 has a dogleg or arch shape, and an angle (internal angle) α less than 180 degrees. An excessive external load may be absorbed by the buckling portion 61, enabling the stress applied to the stacked substrate 3 to be reduced. Therefore, during fabrication of the power semiconductor module, although excessive stress from the mold is applied to the external connection terminal 6, the external connection terminal 6 absorbs the stress, reducing the stress applied to the stacked substrate 3 and enabling cracks in the stacked substrate 3 and breaking of the stacked substrate 3 to be prevented. Furthermore, due to the buckling portion 61, the external connection terminal 6 is less likely to be pulled out.

Figure 2B:
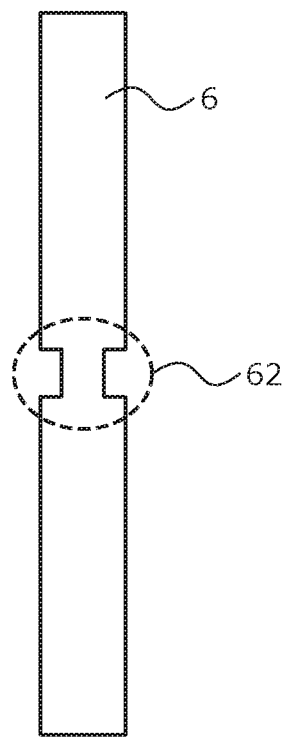
FIG. 2B is a cross-section view depicting an example of the external connection terminal of the power semiconductor module according to the first embodiment.

The external connection terminal 6 has a notch to facilitate buckling and the buckling may occur at the notched part. Further, to further facilitate the buckling, the notch may be placed at an intermediate part of the external connection terminal 6. FIGS. 2A and 2B are cross-section views depicting examples of the external connection terminal of the power semiconductor module according to the first embodiment. In FIG. 2A, as a notch 62, a dogleg-shaped part is provided and at this part, the occurrence of buckling is facilitated. In FIG. 2B, as the notch 62, a part having a small diameter is provided and at this part, the occurrence of buckling is facilitated. The dogleg-shaped part and the part having a small diameter are examples of the notch 62 and the notch 62 may have another shape. For example, the external connection terminal 6 may be formed to have a circular cross-sectional shape, where one part has a star or cross-like shape, thereby forming the notch 62.

The power semiconductor module of the first embodiment is manufactured as follows. FIGS. 3, 4, 5, and 6 are cross-sectional views of the power semiconductor module according to the first embodiment during manufacture. In the method of manufacture, first, the stacked substrate 3 is prepared in which the conductive plate 32 is provided on the front surface of the insulating substrate 31 and the heat dissipating plate 33 is provided on the rear surface. Further, the internal circuit board 8 is prepared in which a via hole for electrical connection is formed penetrating the metal layer, the insulating substrate, and a metal layer, at predetermined positions. Next, the implant pins 9 are press-fitted in the via holes of the internal circuit board 8.

Next, the power semiconductor chips 1 are disposed on the front surface of the conductive plate 32 provided on the stacked substrate 3, and the power semiconductor chips 1 and the conductive plate 32 are electrically connected by a bonding member. Next, at predetermined positions in the power semiconductor chips 1 and the conductive plate 32, the implant pins 9 extending from the internal circuit board 8 are disposed via a bonding member; and the bonding member is melted or sintered, bonding both.

Figure 3:
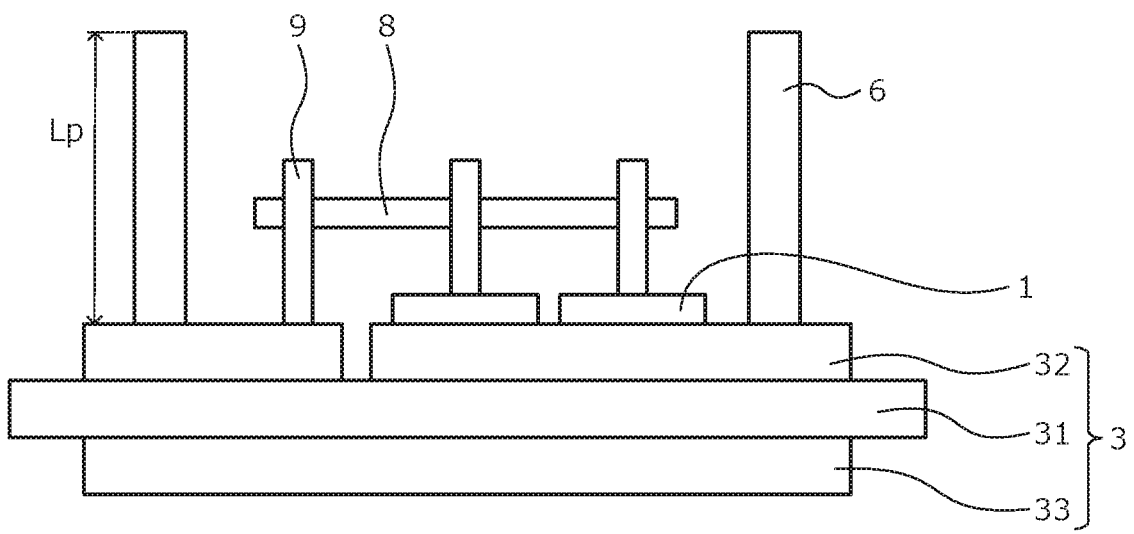
FIG. 3 is a cross-sectional view of the power semiconductor module according to the first embodiment during manufacture.

Next, at predetermined positions in the conductive plate 32, the external connection terminal 6 is disposed via a bonding member; and the bonding member is melted or sintered, bonding both. Holes or grooves may be formed in the conductive plate 32 in advance and the external connection terminal 6 may be press-fitted therein. In this manner, a power semiconductor circuit member is assembled. The state up to here is depicted in FIG. 3.

Figure 4:
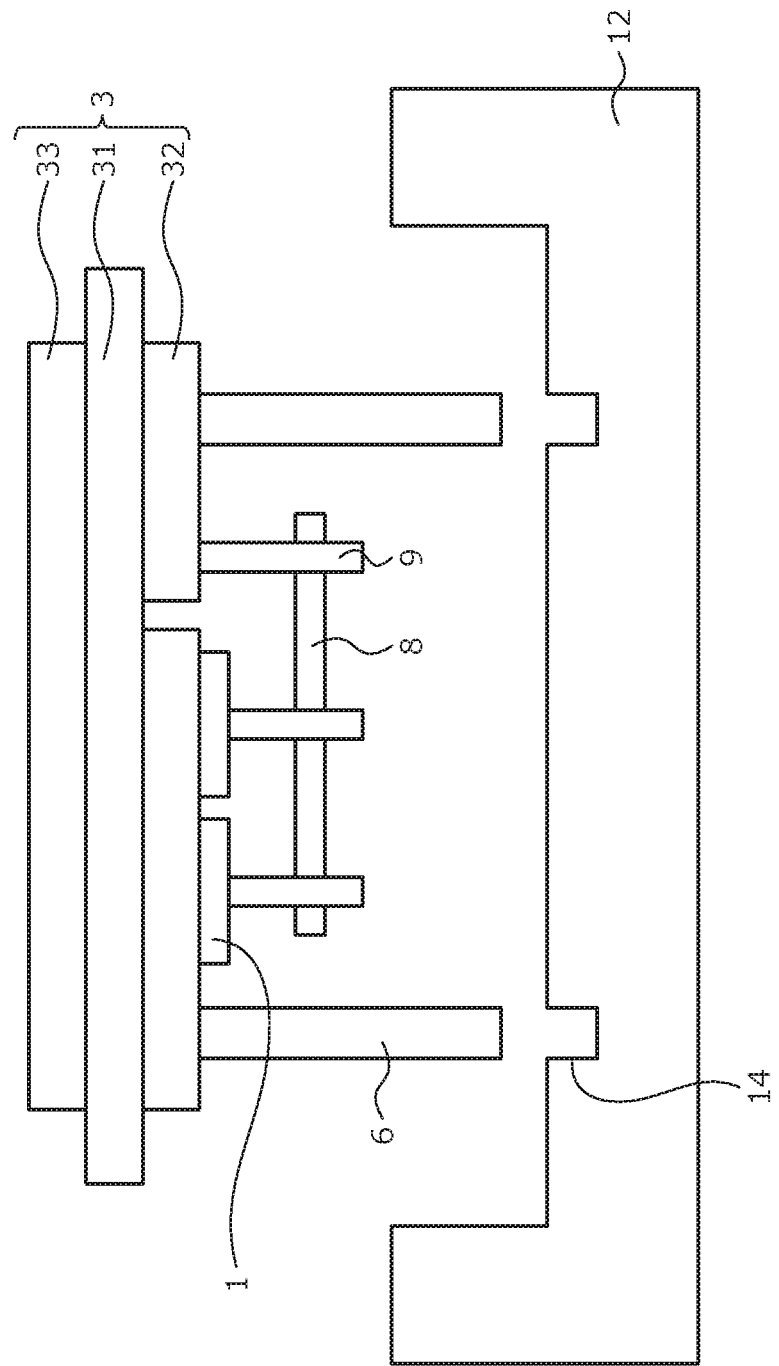
FIG. 4 is a cross-sectional view of the power semiconductor module according to the first embodiment during manufacture.

Next, the power semiconductor circuit member is set in a lower mold 12 for resin molding. At this time, the power semiconductor circuit member is set so that each external connection terminal 6 is inserted in a groove 14 provided in the lower mold 12. The state up to here is depicted in FIG. 4.

Figure 5:
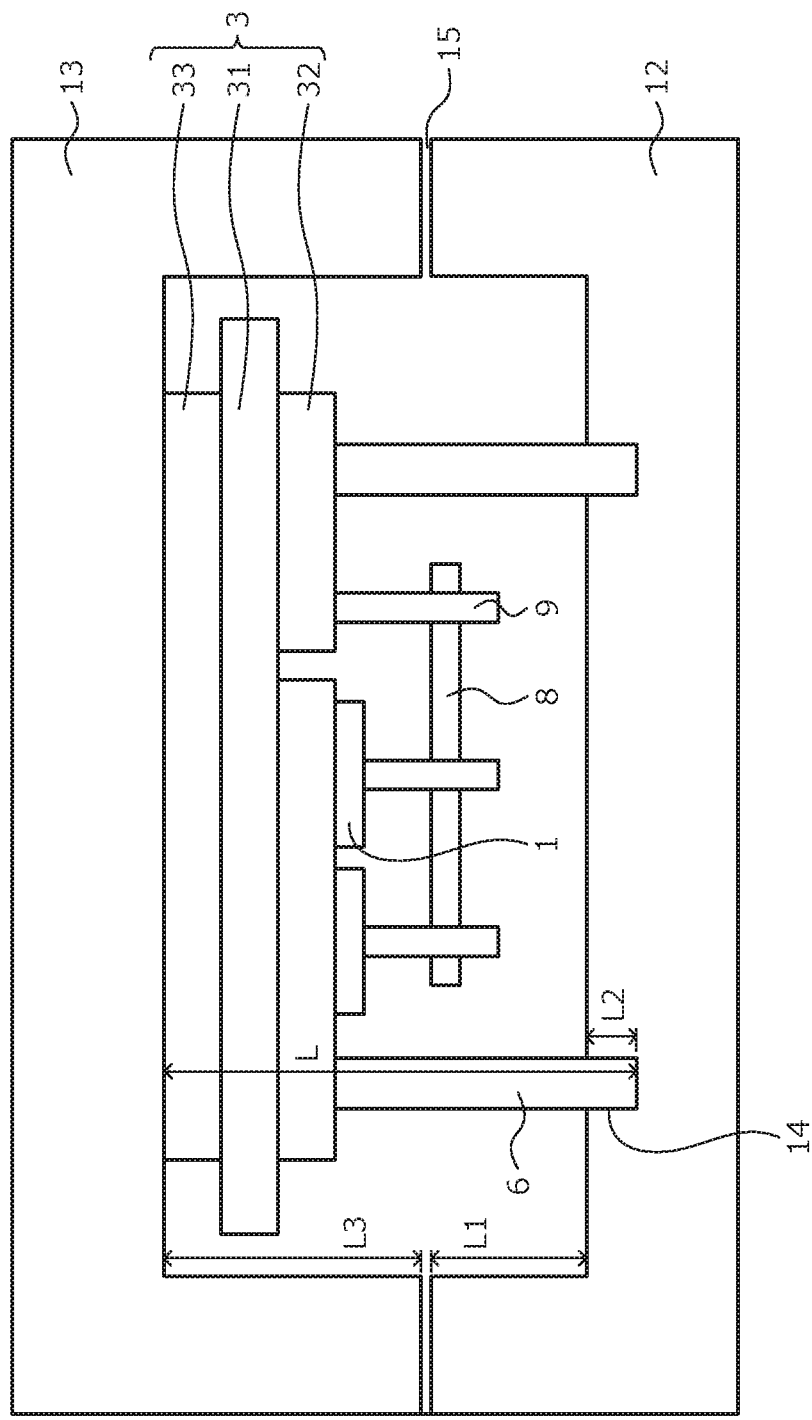
FIG. 5 is a cross-sectional view of the power semiconductor module according to the first embodiment during manufacture.

Next, the power semiconductor circuit member is set in an upper mold 13 for resin molding. At this time, the power semiconductor circuit member is set so that the upper mold 13 and the heat dissipating plate 33 contact each other. The state up to here is depicted in FIG. 5. In FIGS. 4 and 5, while the lower mold 12 is set and thereafter, the upper mold 13 is set, a sequence in which the lower mold 12 and the upper mold 13 are set may be reversed.

Here, a height L of the power semiconductor circuit member including the external connection terminal 6 is greater than a sum of a height L1 of an inner surface of the lower mold 12, a depth L2 of the groove 14 of the lower mold 12, and a height L3 of an inner surface of the upper mold 13 (L>L1+L2+L3). Therefore, a gap 15 occurs between the lower mold 12 and the upper mold 13.

Figure 6:
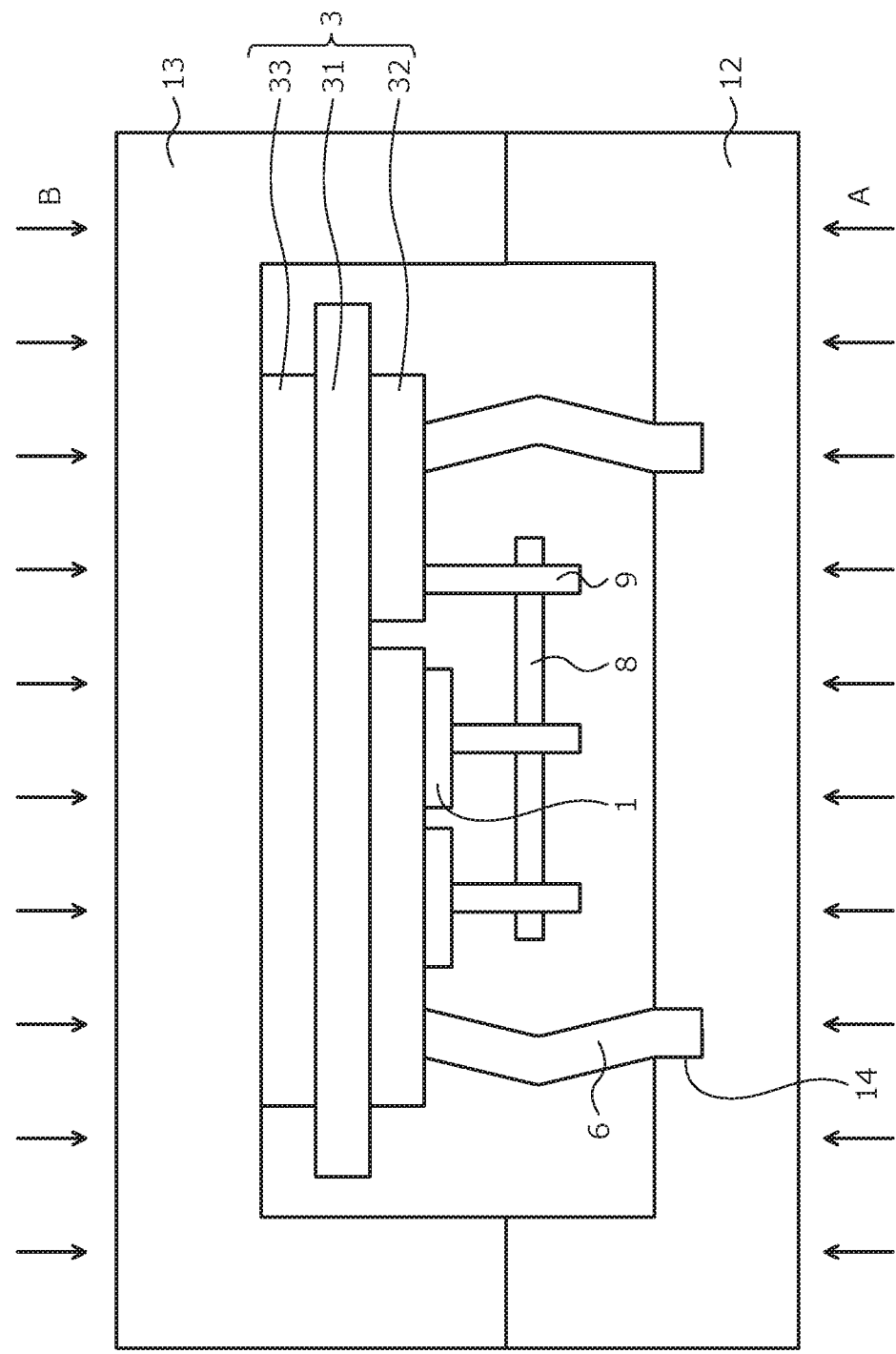
FIG. 6 is a cross-sectional view of the power semiconductor module according to the first embodiment during manufacture.

In this state, when the sealing insulation material 4 is injected in the mold, resin leaks from the gap 15. Therefore, next, pressure on the lower mold 12 in a direction indicated by arrow A and pressure on the upper mold 13 in a direction indicated by arrow B are applied, whereby mold clamping is carried out. By this mold clamping, the lower mold 12 and the upper mold 13 are adhered to each other and the gap 15 disappears. Further, the heat dissipating plate 33 is strongly pressed by the upper mold 13, whereby warping of the stacked substrate 3 is suppressed. Further, the external connection terminal 6 is strongly pressed by the lower mold 12, whereby the external connection terminal 6 buckles, enabling damage of the stacked substrate 3 to be prevented. The state up to here is depicted in FIG. 6.

Next, the mold for resin molding is filled with the sealing insulation material 4 made of a hard resin such as an epoxy resin. Molding of the sealing insulation material 4 may be transfer molding or injection molding. Thus, the power semiconductor module according to the first embodiment depicted in FIG. 1 is completed. At the time of molding, the heat dissipating plate 33 is pressed strongly against the upper mold 13, whereby the sealing insulation material 4 is prevented from entering between the heat dissipating plate 33 and the upper mold 13. Therefore, a semiconductor module having good heat dissipating properties is possible without excess resin at the rear surface of the heat dissipating plate 33. Further, warping of the power semiconductor module caused by curing shrinkage of the resin at the time of molding can be suppressed.

As described above, according to the power semiconductor module according to the first embodiment, the external connection terminal is connected to the conductive plate and is provided erectly from the insulating sealing material to the outside. As a result, a semiconductor module having good heat dissipating properties without excess resin at the heat dissipating surface is obtained. Further, warping of the power semiconductor module is suppressed. Further, according to the power semiconductor module of the first embodiment, the external connection terminal has the buckling portion. As a result, an excessive external load may be absorbed, reducing the stress applied to the stacked sub-strate. In this manner, excessive stress applied by the mold during fabrication of the power semiconductor module is absorbed by the external connection terminal. Therefore, the stress applied to the stacked substrate is reduced, enabling damage of the stacked substrate to be prevented.

While not depicted, in the power semiconductor module according to the first embodiment, the external connection terminal 6 may be formed to have a terminal exposed to the outside, and a bonding member 2 provided between the terminal and the conductive plate 32. The bonding member 2 is an expanding and contracting portion made of a soft material such as solder. According to such a power semiconductor module, the external connection terminal 6 has the buckling portion and the expanding and contracting portion. Therefore, an external load may be absorbed by the buckling portion and the expanding and contracting portion, reducing the stress applied to the stacked substrate and enabling damage of the stacked substrate to be prevented.

Figure 7:
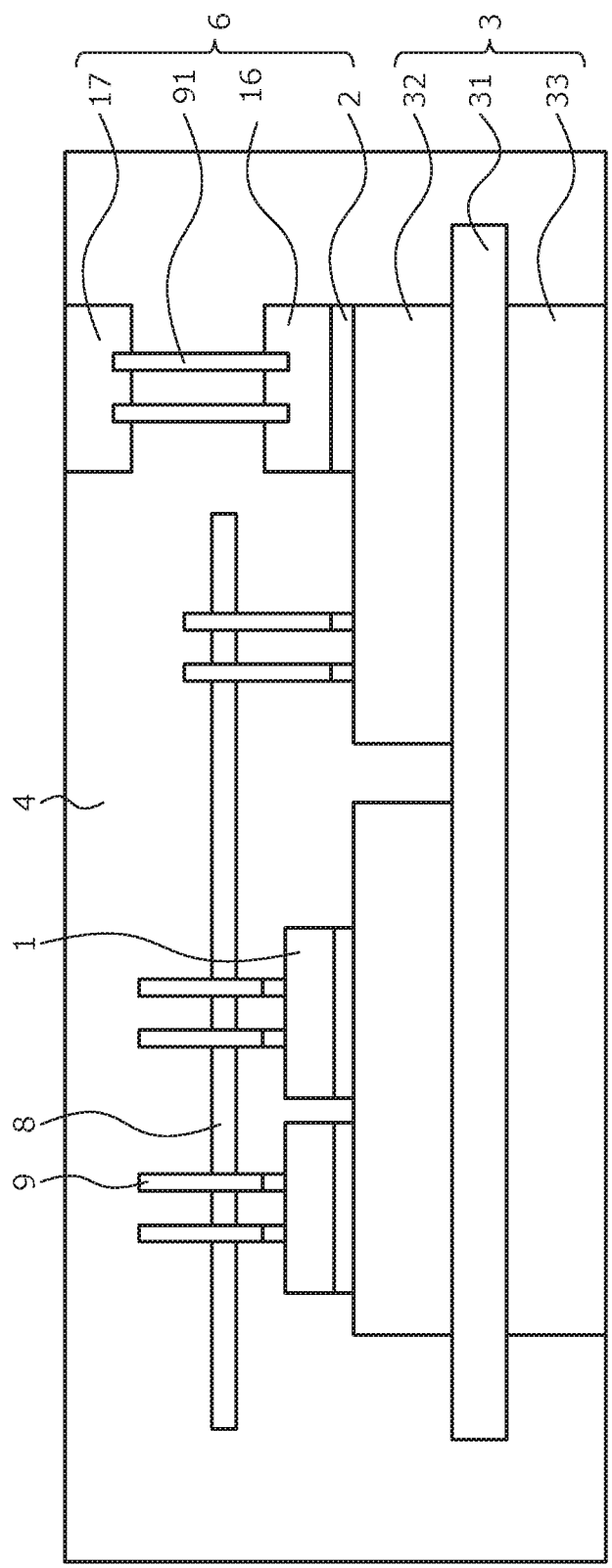
FIG. 7 is a cross-sectional view of the structure of the power semiconductor module according to a second embodiment.

Next, a structure of the power semiconductor module according to a second embodiment will be described. FIG. 7 is a cross-sectional view of the structure of the power semiconductor module according to the second embodiment. The power semiconductor module according to the second embodiment differs from the power semiconductor module according to the first embodiment in that the external connection terminal 6 is constituted by an implant pin 91, a lower conductive plate 16, an upper conductive plate 17 and the bonding member 2; the bonding member 2 being provided between the conductive plate 32 and the lower conductive plate 16.

In the second embodiment, the implant pin 91 is press-fitted in the lower conductive plate 16 and the upper conductive plate 17; the lower conductive plate 16 is bonded to the conductive plate 32 by the bonding member 2. The bonding member 2 is the expanding and contracting portion made of a soft material such as solder. When stress from the mold is applied, the expanding and contracting portion compresses and thereby, absorbs the stress. Therefore, the stress applied to the stacked substrate 3 may be reduced by the bonding member 2. In FIG. 7, while two of the implant pins 91 are provided between the lower conductive plate 16 and the upper conductive plate 17, three or more may be provided. The quantity is determined by the electrical resistance and the allowable current of the implant pins 91. Further, since stress may be absorbed by the buckling portion, the implant pins 91 may have the buckling portion similarly to the external connection terminal 6 of the first embodiment. Furthermore, the implant pins 91 may have a notch facilitating buckling similarly to that in the first embodiment as depicted in FIGS. 2A and 2B, and the implant pins 91 may buckle at the part having the notch.

Further, in the second embodiment, the lower conductive plate 16 is provided, whereby the stacked substrate 3 is pushed over a wide surface by the external connection terminals 6 of the first embodiment. Therefore, the pressure applied to the stacked substrate 3 decreases. Furthermore, in the second embodiment, the upper conductive plate 17 is in contact with the lower mold 12 at a surface. Thus, similarly to the first embodiment, the grooves 14 are provided in the lower mold 12, and work for aligning the external connection terminals 6 with the groove 14 becomes unnecessary. Further, the lower conductive plate 16 functions as a temperature absorbing body, enabling heat of the power semiconductor chips 1 to be absorbed.

The power semiconductor module of the second embodiment is manufactured by a method similar to the method for the power semiconductor module of the first embodiment.

For example, in the first embodiment, the external connection terminal 6 is disposed at predetermined positions in the conductive plate 32 via the bonding member 2; and the bonding member 2 is melted or sintered, bonding both. In place of this, in the second embodiment, at predetermined positions in the conductive plate 32, the lower conductive plate 16 is disposed via the bonding member 2; and the bonding member 2 is melted or sintered, bonding both. Next, the implant pins 91 are press-fitted to the lower conductive plate 16, and the upper conductive plate 17 is press-fitted to upper ends of the implant pins 91, i.e., ends on an opposite side of ends of the implant pins 91 connected to the lower conductive plate 16.

Further, the implant pins 91 may be press-fitted in advance to the lower conductive plate 16 and the upper conductive plate 17 and after assembly of the external connection terminal 6, the external connection terminal 6 may be disposed at a predetermined position in the conductive plate 32, via the bonding member 2.

As described, according to the power semiconductor module according to the second embodiment, the external connection terminal has the buckling portion and the expanding and contracting portion. External load may be absorbed by the buckling portion and the expanding and contracting portion; and the second embodiment may achieve effects similar to those of the first embodiment.

Figure 8:
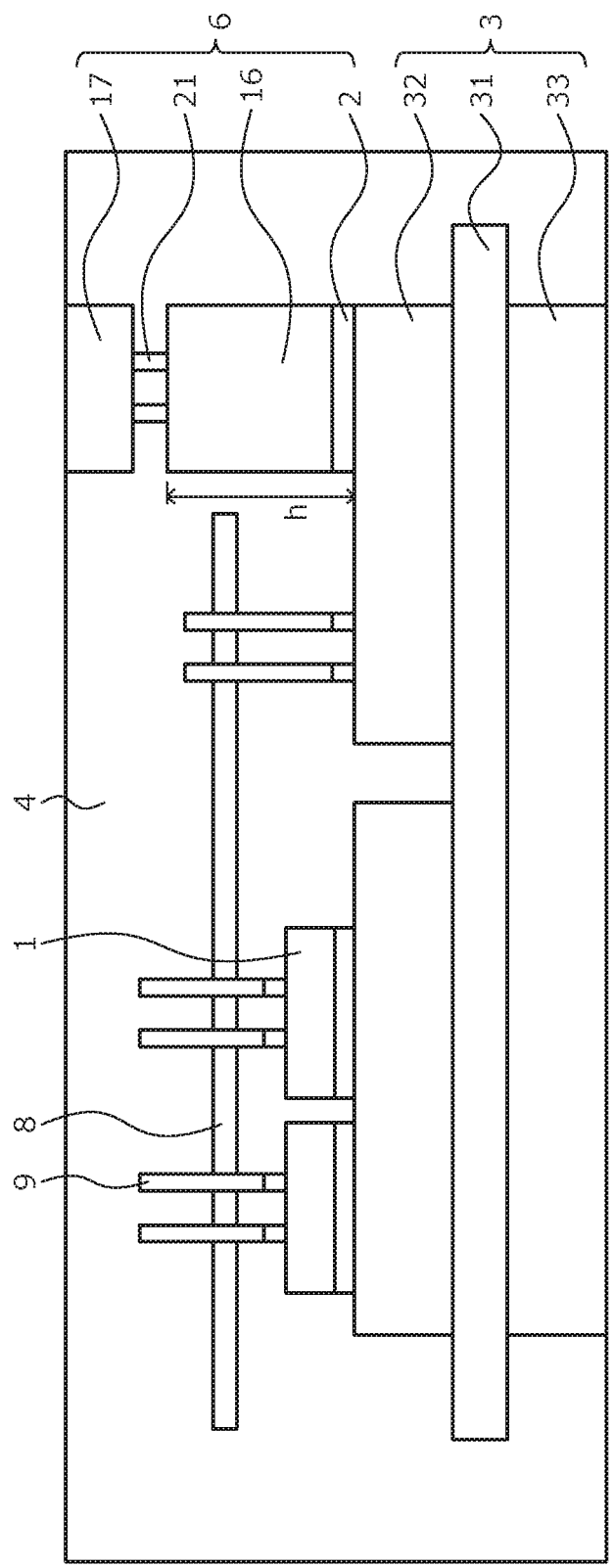
FIG. 8 is a cross-sectional view of the structure of the power semiconductor module according to a third embodiment.

Next, a structure of the power semiconductor module according to a third embodiment will be described. FIG. 8 is a cross-sectional view of the structure of the power semiconductor module according to the third embodiment. The power semiconductor module according to the third embodiment differs from the power semiconductor module according to the second embodiment in that in place of the implant pin 91, an upper bonding member 21 is provided.

The upper bonding member 21, similarly to the bonding member 2, is the expanding and contracting portion made of a soft material such as solder. Further, the upper bonding member 21, unlike the bonding member 2, is not provided between the entire surfaces of the lower conductive plate 16 and the upper conductive plate 17 and, for example, has a rod-like shape. This is because when the contact area is large, the upper bonding member 21 is more difficult to compress and the extent that the external stress is reduced decreases.

Further, since the upper bonding member 21 is made of a soft material such as solder, the upper bonding member 21 cannot be equal to the height of the implant pin 9. Therefore, in the third embodiment, a height h of the lower conductive plate 16 is greater than that in the case of the second embodiment. While a height of the upper conductive plate 17 may also be increased, in this case, the upper conductive plate 17 becomes heavy and therefore, the upper bonding member 21 is compressed by this weight, reducing the extent that the external stress is reduced. Therefore, the height h of the lower conductive plate 16 may be increased.

In the third embodiment, when stress from the mold is applied, the stress is absorbed by compression of the expanding and contracting portion. Therefore, the stress applied to the stacked substrate 3 may be reduced by the upper bonding member 21 and the bonding member 2. In FIG. 8, while two of the upper bonding members 21 are provided between the lower conductive plate 16 and the upper conductive plate 17, three or more may be provided. The quantity is determined by the electrical resistance and the allowable current of the upper bonding members 21.

The power semiconductor module of the third embodiment is manufactured by a method similar to that for the power semiconductor module of the second embodiment. For example, in the second embodiment, the implant pins 91 are press-fitted to the lower conductive plate 16, and the upper conductive plate 17 is connected to the upper ends of the implant pins 91. In place of this, in the third embodiment, the upper conductive plate 17 is disposed at predetermined positions in the lower conductive plate 16, via the upper bonding members 21; and the upper bonding members 21 are melted or sintered, bonding both.

Further, the upper bonding members 21 may disposed between the lower conductive plate 16 and the upper conductive plate 17; and the upper bonding members 21 may be melted or sintered, bonding both, in advance, and after assembly of the external connection terminal 6, the external connection terminal 6 may be disposed a predetermined position in the conductive plate 32, via the bonding member 2.

As described, according to the power semiconductor module according to the third embodiment, the external connection terminal has the expanding and contracting portion and therefore, effects similar to those of the second embodiment are obtained.

Figure 9:
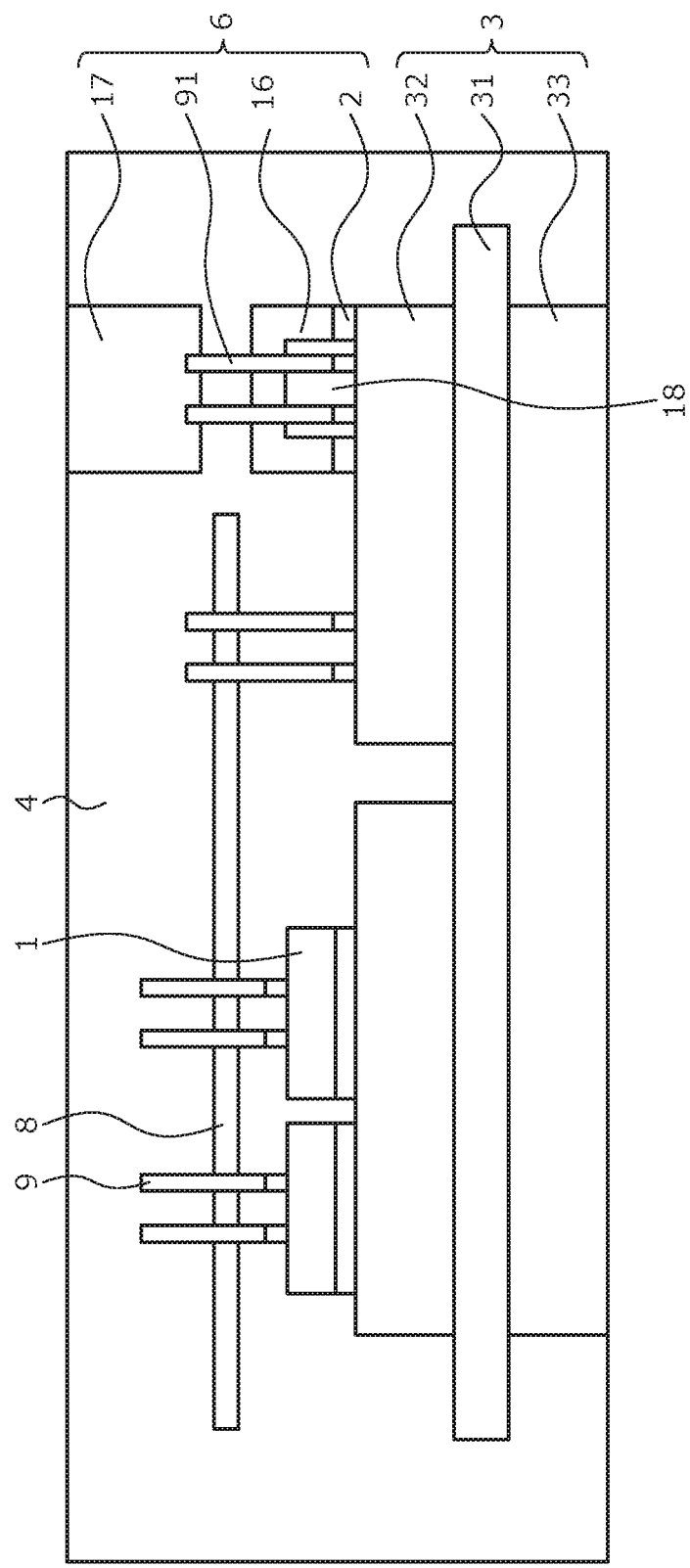
FIG. 9 is a cross-sectional view of the structure of the power semiconductor module according to a fourth embodiment.

Next, a structure of the power semiconductor module according to a fourth embodiment will be described. FIG. 9 is a cross-sectional view of the structure of the power semiconductor module according to the fourth embodiment. The power semiconductor module according to the fourth embodiment differs from the power semiconductor module according to the second embodiment in that a hollow structure 18 is provided at the lower conductive plate 16 and the implant pin 91 is bonded to the conductive plate 32, via the bonding member 2.

In the fourth embodiment, a via hole penetrating the lower conductive plate 16 is provided in the lower conductive plate 16 and in this via hole, the implant pin 91 is press-fitted. Further, the implant pin 91, similarly to the external connection terminal 6 of the first embodiment, may have the buckling portion. The stress may be absorbed by the buckling portion. Furthermore, the implant pin 91 may have a notch facilitating buckling similarly to that in the first embodiment as depicted in FIGS. 2A and 2B, and the implant pin 91 may buckle at the part having the notch.

Further, the implant pin 91 has a tin (Sn)-plated surface, poor contact with the sealing insulation material 4, and the implant pins 91 is susceptible to coming out. Therefore, the buckling portion of the implant pin 91 may be provided in the hollow structure 18. In this case, the external connection terminal 6 buckles and deforms in the hollow structure 18, whereby an anchoring effect makes the implant pin 91 more resistant to coming out.

In the fourth embodiment as well, when stress from the mold is applied, the stress is absorbed by the buckling of the buckling portion and compression of the expanding and contracting portion. Therefore, the stress applied to the stacked substrate 3 may be reduced by the implant pin 91 and the bonding member 2. In FIG. 9, while two of the implant pins 91 are provided between the conductive plate 32 and the upper conductive plate 17, three or more may be provided. The quantity is determined by the electrical resistance and the allowable current of the implant pins 91.

The power semiconductor module of the fourth embodiment may be manufactured by a method similar to that for the power semiconductor module of the second embodiment. For example, in the second embodiment, the lower conductive plate 16 is disposed at predetermined positions in the conductive plate 32, via the bonding member 2. In the third embodiment, in place of this, the lower conductive plate 16 having the implant pins 91 and the hollow structure 18 at predetermined positions in the conductive plate 32 is disposed via the bonding member 2.

Further, the implant pins 91 may be press-fitted, in advance, to the upper conductive plate 17 and the lower conductive plate 16 having the hollow structure 18, and after assembly of the external connection terminal 6, the external connection terminal 6 may be disposed at a predetermined position in the conductive plate 32, via the bonding member 2.

As described, according to the power semiconductor module according to the fourth embodiment, the external connection terminal has the buckling portion and the expanding and contracting portion. Therefore, the power semiconductor module according to the fourth embodiment has effects similar to those of the first embodiment. Further, in the fourth embodiment, the hollow structure is provided in the lower conductive plate and the external connection terminal buckles and deforms in the hollow structure, whereby an anchoring effect makes the external connection terminal more resistant to coming out.

Figure 10:
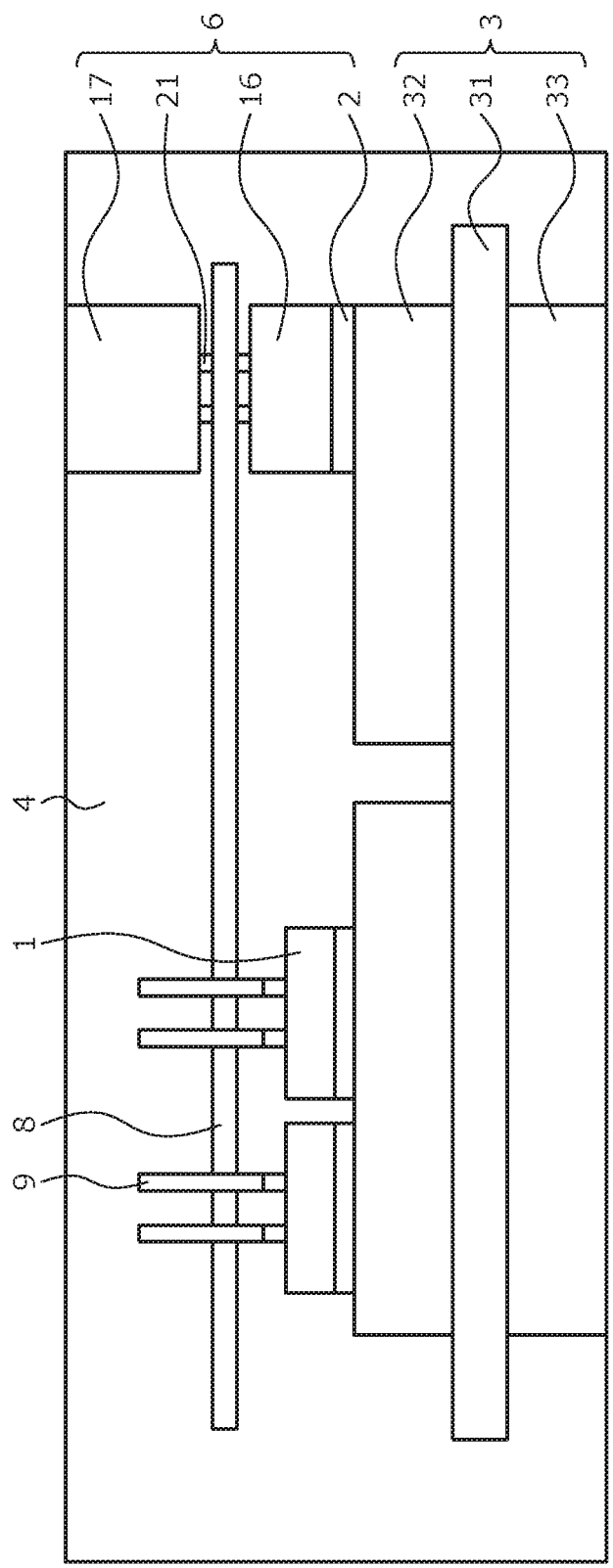
FIG. 10 is a cross-sectional view of the structure of the power semiconductor module according to a fifth embodiment.

Next, a structure of the power semiconductor module according to a fifth embodiment will be described. FIG. 10 is a cross-sectional view of the structure of the power semiconductor module according to the fifth embodiment. The power semiconductor module according to the fifth embodiment differs from the power semiconductor module according to the third embodiment in that the internal circuit board 8 is bonded to the upper bonding members 21.

In particular, the metal layer of the internal circuit board 8 and the upper bonding members 21 are bonded to each other. Therefore, heat generated by the power semiconductor chip may be discharged outside, via the implant pins 9, the internal circuit board 8, and the upper conductive plate 17.

In the fifth embodiment as well, when stress from the mold is applied, the stress is absorbed by compression of the expanding and contracting portion. Therefore, the stress applied to the stacked substrate 3 may be reduced by the upper bonding member 21 and the bonding member 2. In FIG. 10, while two of the upper bonding members 21 are provided between the lower conductive plate 16 and the upper conductive plate 17, three or more may be provided. The quantity is determined by the electrical resistance and the allowable current of the upper bonding members 21.

The power semiconductor module of the fifth embodiment may be manufactured by a method similar to that for the power semiconductor module of the third embodiment. For example, in the third embodiment, the upper conductive plate 17 is disposed at a predetermined position in the lower conductive plate 16, via the upper bonding members 21. In the fifth embodiment, in place of this, the internal circuit board 8 is disposed at a predetermined position in the lower conductive plate 16, via the upper bonding members 21, and the upper conductive plate 17 is disposed at a predetermined position in the internal circuit board 8, via the upper bonding members 21.

Further, the upper conductive plate 17 and the lower conductive plate 16 may be disposed at a predetermined position in the internal circuit board 8, via the upper bonding members 21; and the lower conductive plate 16 may be disposed at a predetermined position in the conductive plate 32, via the bonding member 2.

As described, according to the power semiconductor module according to the fifth embodiment, the external connection terminal has the expanding and contracting portion. Therefore, the power semiconductor module according to the fifth embodiment has effects similar to those of the second embodiment. Further, in the fifth embodiment, the internal circuit board and the upper bonding member are bonded to each other. Therefore, heat generated by the power semiconductor chip may be discharged outside, via the upper conductive plate.

Figure 11:
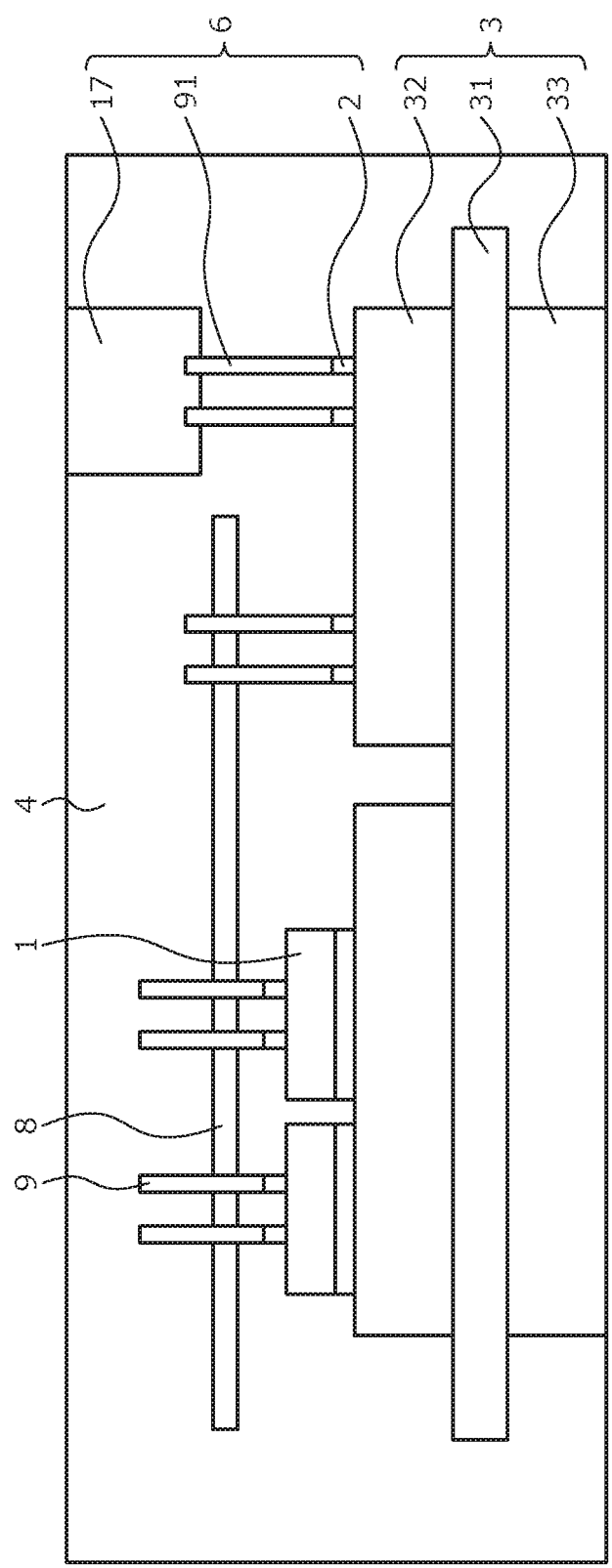
FIG. 11 is a cross-section view of the structure of the power semiconductor module according to a sixth embodiment.

Next, a structure of the power semiconductor module according to a sixth embodiment will be described. FIG. 11 is a cross-section view of the structure of the power semiconductor module according to the sixth embodiment. The power semiconductor module according to the sixth embodiment differs from the power semiconductor module according to the fourth embodiment in that the lower conductive plate 16 having the hollow structure is not provided.

Further, the implant pins 91 may have the buckling portion similarly to the external connection terminal 6 of the first embodiment, to absorb the stress by the buckling portion. Furthermore, the implant pins 91 may have a notch that facilitates buckling as depicted in FIGS. 2A and 2B of the first embodiment and may buckle at the part having the notch.

In the sixth embodiment as well, when stress from the mold is applied, the stress is absorbed by the buckling of the buckling portion and compression of the expanding and contracting portion. Therefore, the stress applied to the stacked substrate 3 may be reduced by the implant pins 91 and the bonding members 2. In FIG. 11, while two of the implant pins 91 are disposed between the conductive plate 32 and the upper conductive plate 17, three or more may be disposed. The quantity is determined by the electrical resistance and the allowable current of the implant pins 91.

The power semiconductor module of the sixth embodiment is manufactured by a method similar to that for the power semiconductor module of the fourth embodiment. For example, in the fourth embodiment, the lower conductive plate 16 having the hollow structure and the implant pins 91 at predetermined positions in the conductive plate 32 is disposed via the bonding members 2. In the sixth embodiment, in place of this, the implant pins 91 are disposed at predetermined positions in the conductive plate 32, via the bonding members 2.

Further, the implant pins 91 may be press-fitted to the upper conductive plate 17 in advance and after assembly of the external connection terminal 6, the external connection terminal 6 may be disposed at a predetermined position in the conductive plate 32, via the bonding members 2.

As described, according to the power semiconductor module according to the sixth embodiment, external connection terminal has the buckling portion and the expanding and contracting portion, whereby effects similar to those of the second embodiment are obtained.

Here, the sixth embodiment is an embodiment in which the lower conductive plate 16 is removed from the power semiconductor module according to the second embodiment, for example, refer to FIG. 7, and the bonding members 2 are provided between the implant pins 91 and the conductive plate 32. Although not depicted, the sixth embodiment may be an embodiment in which the upper conductive plate 17 is removed from the power semiconductor module according to the second embodiment, the implant pins 91 are exposed to the outside, and the bonding members 2 are provided between the lower conductive plate 16 and the conductive plate 32. In this case as well, the buckling portion and the expanding and contracting portion are provided and therefore, effects similar to those of the second embodiment are obtained. Moreover, the sixth embodiment may be an embodiment in which the bonding members 2 are provided between the lower conductive plate 16 and the implant pins 91, and not between the lower conductive plate 16 and the conductive plate 32. In this case as well, the buckling portion and the expanding and contracting portion are provided. Therefore, effects similar to those of the second embodiment are obtained.

Figure 12:
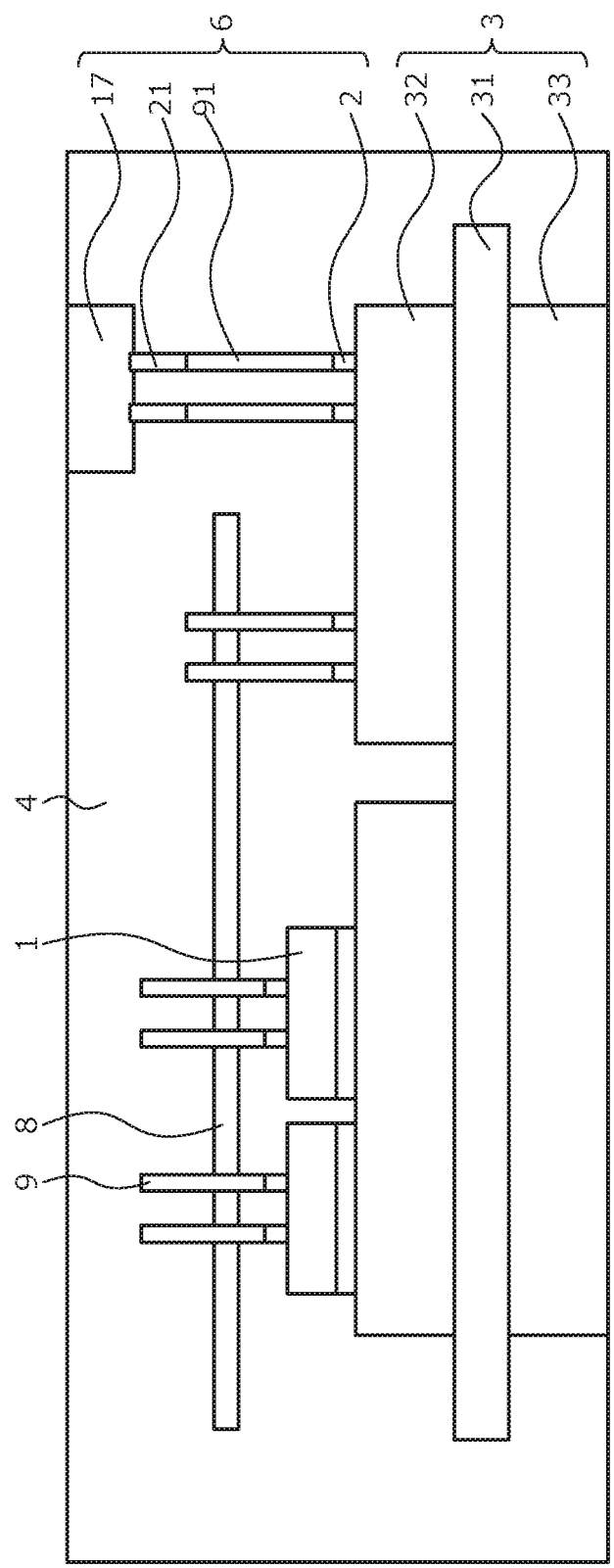
FIG. 12 is a cross-sectional view of the structure of the power semiconductor module according to a seventh embodiment.

Next, a structure of the power semiconductor module according to a seventh embodiment will be described. FIG. 12 is a cross-sectional view of the structure of the power semiconductor module according to the seventh embodiment. The power semiconductor module according to the seventh embodiment differs from the power semiconductor module according to the sixth embodiment in that the upper bonding members 21 are provided between the implant pins 91 and the upper conductive plate 17.

In the seventh embodiment, the upper bonding members 21 also function as the expanding and contracting portion. Therefore, the stress applied to the stacked substrate 3 may be reduced further as compared to the sixth embodiment. Further, the implant pins 91 may have the buckling portion similarly to the external connection terminal 6 of the first embodiment, whereby the stress may be absorbed by the buckling portion. Moreover, the implant pins 91 may have a notch that facilitates buckling as depicted in FIGS. 2A and 2B of the first embodiment and may buckle at the part having the notch.

In the seventh embodiment as well, when stress from the mold is applied, the stress is absorbed by the buckling of the buckling portion and compression of the expanding and contracting portion. Therefore, the stress applied to the stacked substrate 3 may be reduced by the implant pins 91, the bonding members 2, and the upper bonding members 21. In FIG. 12, while two of the implant pins 91 are disposed between the conductive plate 32 and the upper conductive plate 17, three or more may be provided. The quantity is determined by the electrical resistance and the allowable current of the implant pins 91.

The power semiconductor module of the seventh embodiment is manufactured by a method similar to that for the power semiconductor module of the sixth embodiment. For example, in the sixth embodiment, the upper conductive plate 17 and the implant pins 91 are press-fitted to each other. In the seventh embodiment, in place of this, the implant pins 91 are disposed at predetermined positions in the upper conductive plate 17 via the upper bonding members 21, and the upper bonding members 21 are melted or sintered, bonding both.

Further, the implant pins 91 may be bonded at predetermined positions in the upper conductive plate 17 in advance and after assembly of the external connection terminal 6, the external connection terminal 6 may be disposed at a predetermined position in the conductive plate 32, via the bonding member 2.

As described, according to the power semiconductor module according to the seventh embodiment, the external connection terminal has the buckling portion and the expanding and contracting portion, whereby effects similar to those of the second embodiment are obtained. Further, in the seventh embodiment, the expanding and contracting portion is provided between the upper conductive plate and the implant pins, enabling the stress applied to the stacked substrate to be further reduced as compared to the sixth embodiment.

Figure 13:
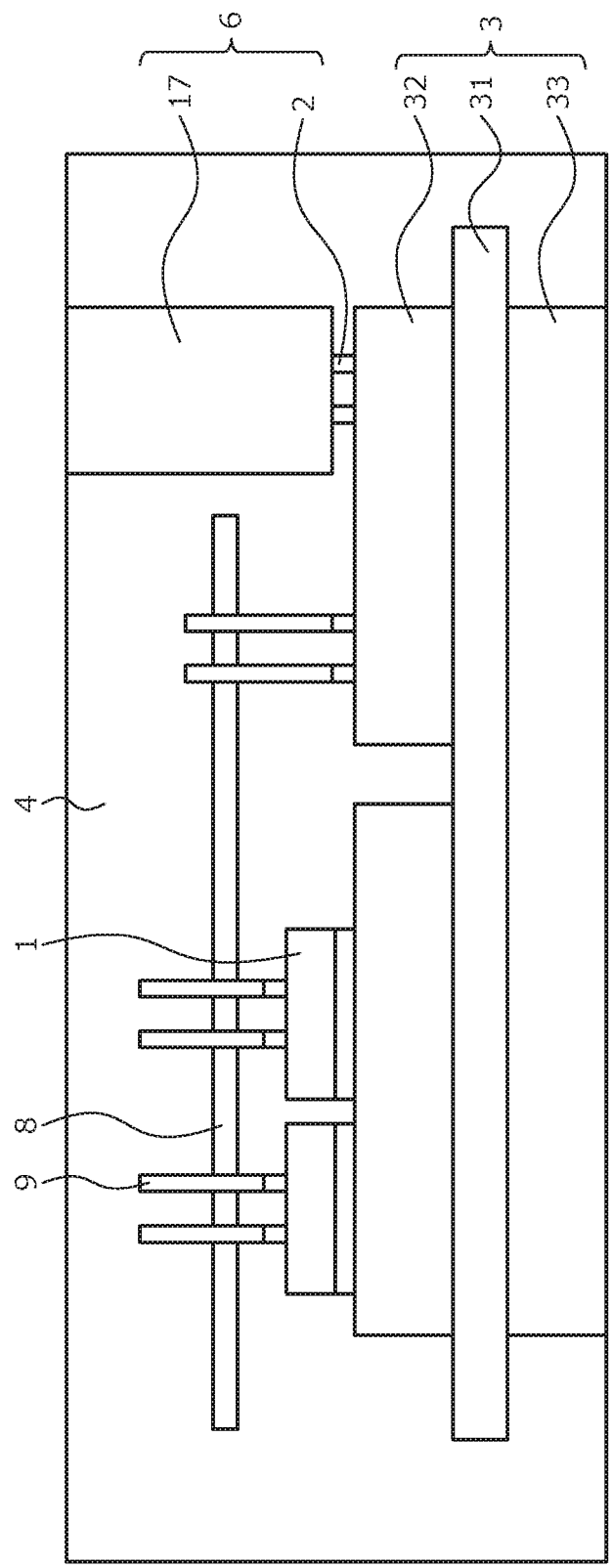
FIG. 13 is a cross-sectional view of the structure of the power semiconductor module according to an eighth embodiment.

Next, a structure of the power semiconductor module according to an eighth embodiment will be described. FIG. 13 is a cross-sectional view of the structure of the power semiconductor module according to the eighth embodiment. The power semiconductor module according to the eighth embodiment differs from the power semiconductor module according to the sixth embodiment in that the implant pins 91 are not provided, and the bonding members 2 are provided between the conductive plate 32 and the upper conductive plate 17.

The bonding members 2 of the eighth embodiment differ from the bonding members 2 of other embodiments, are not provided between the entire surfaces of the conductive plate 32 and the upper conductive plate 17, and, for example, have a rod-like shape. This is because when the contact area is large, the bonding members 2 are more difficult to compress and the extent that the external stress is reduced decreases.

In the eighth embodiment as well, when stress from the mold is applied, the stress is absorbed by compression of the expanding and contracting portion. Therefore, the stress applied to the stacked substrate 3 may be reduced by the bonding members 2. In FIG. 13, while two of the bonding members 2 are provided between the conductive plate 32 and the upper conductive plate 17, three or more may be provided. The quantity is determined by the electrical resistance and the allowable current of the bonding members 2.

The power semiconductor module of the eighth embodiment is manufacture by a method similar to that for the power semiconductor module of the sixth embodiment. For example, in the sixth embodiment, the implant pins 91 are disposed at predetermined positions in the conductive plate 32, via the bonding members 2. In the eighth embodiment, in place of this, the upper conductive plate 17 is disposed at a predetermined position in the conductive plate 32, via the bonding members 2.

As described, according to the power semiconductor module according to the eighth embodiment, the external connection terminal has the expanding and contracting portion, whereby effects similar to those of the second embodiment are obtained.

Further, in the first embodiment, when the buckling amount of the external connection terminal 6 is small, the pressure applied to the stacked substrate 3 may not be sufficiently absorbed. On the contrary, when the buckling amount of the external connection terminal 6 is large, the pressure applied to the stacked substrate 3 increases. The angle $\alpha$, refer to FIG. 1, of the buckling portion 61 may satisfy $120° \leq \alpha \leq 177°$ and may further satisfy $145° \leq \alpha \leq 175°$. This has an effect of making the external connection terminal 6 more resistant to coming out. Therefore, a length Lp of the external connection terminal 6 is a length, refer to FIG. 3, prior to buckling and a length Lp' of the external connection terminal 6 is a length, refer to FIG. 1, after buckling and may satisfy $0.860 \leq Lp'/Lp \leq 0.9997$ and may further satisfy $0.954 \leq Lp'/Lp \leq 0.999$.

On the other hand, in the second, fourth, sixth and seventh embodiments, when the implant pins 91 are too short, the implant pins 91 do not buckle and absorption of the pressure by the buckling disappears. Therefore, the length of the implant pins 91 has to be a certain length or larger, as described below.

Figure 14:
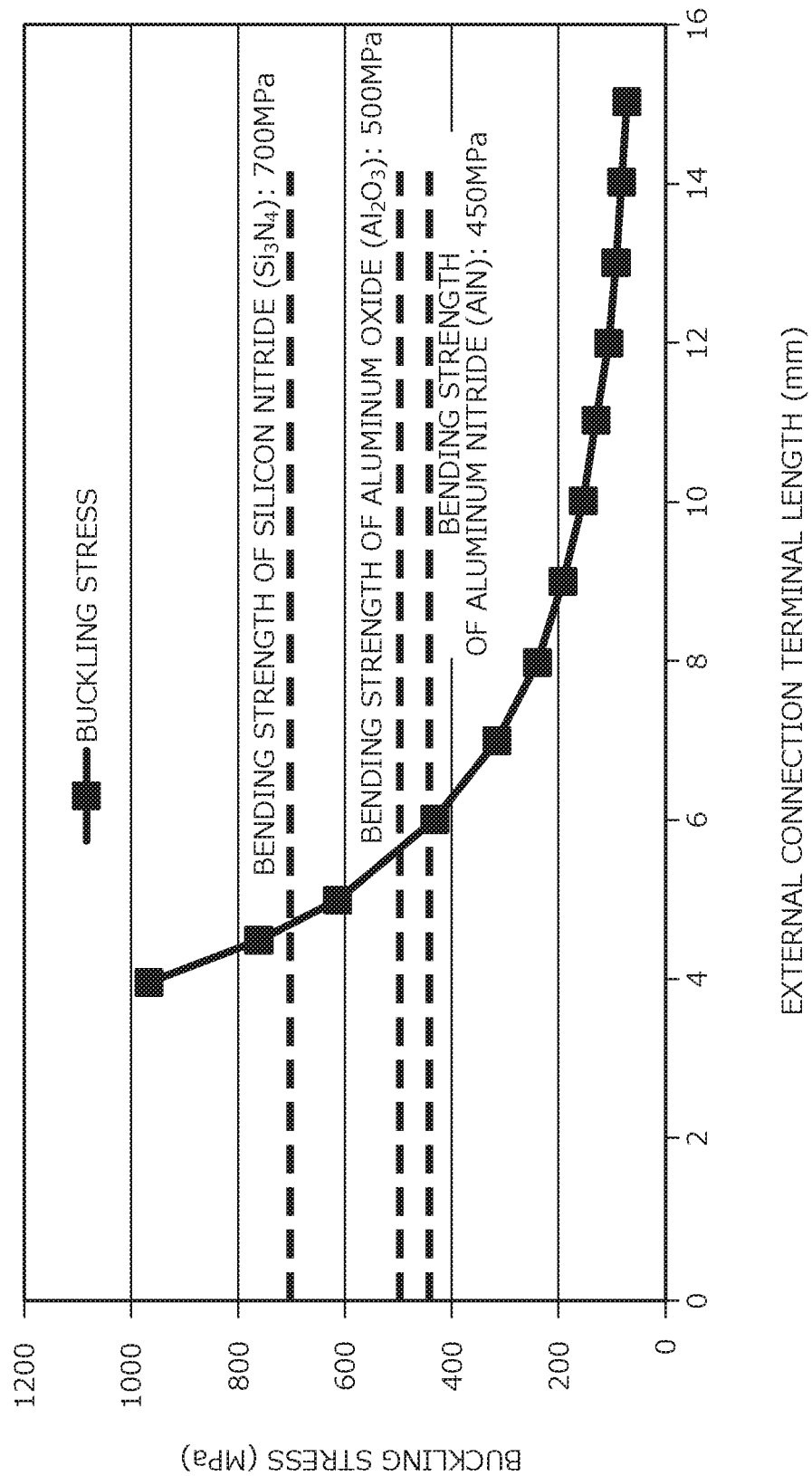
FIG. 14 is a graph depicting a relationship of external connection terminal length and buckling stress.

FIG. 14 is a graph depicting a relationship of external connection terminal length and buckling stress. In FIG. 14, a vertical axis represents buckling stress applied to the stacked substrate 3 in units of MPa, and a horizontal axis represents the length of the external connection terminal 6 in units of mm. FIG. 14 depicts results of calculation of the buckling stress using the Formula of Euler in a state where one terminal is fixed to the external connection terminal 6 that is made of copper having a 1 mm diameter and Young's modulus of 100940 MPa, while the other terminal is free. Further, in FIG. 14, bending strengths of aluminum oxide, silicon nitride, and aluminum nitride used in the stacked substrate 3 are indicated by broken lines.

The buckling stress has to be less than the bending strengths so that the stacked substrate 3 is not damaged by the stress from the external connection terminal 6. However, to allow a margin, the buckling stress may be less than 80% of the bending strengths and also in the case of the implant pins 91, is the same as the external connection terminal 6.

Therefore, in the first, second, fourth, sixth, and seventh embodiments, when silicon nitride is used in the stacked substrate 3, the external connection terminal 6 or the implant pins 91 having a length that is 5.2 mm or larger may be used. When aluminum oxide is used in the stacked substrate 3, the external connection terminal 6 or the implant pins 91 having a length that is 6.2 mm or larger may be used. When aluminum nitride is used in the stacked substrate 3, the external connection terminal 6 or the implant pins 91 having a length that is 6.6 mm or larger may be used.

The external connection terminal 6 and the implant pins 91 are current paths of the power semiconductor chips 1 and the thicker the external connection terminal 6 and the implant pins 91 are, the easier current flows. When the external connection terminal 6 and the implant pins 91 are thin, buckling easily occurs. Therefore, the quantities of the external connection terminal 6 and the implant pins 91 may be increased and the thickness may be reduced. Further, the external connection terminal 6 and the implant pins 91 may be round pins or square pins.

Further, in the first to eighth embodiments, when solder is used as the bonding members 2, the softer the solder is, the easier the solder shrinks, and the pressure applied to the stacked substrate 3 decreases. Therefore, the solder has to be suitably selected for the material of the stacked substrate 3.

Figures 15, 16:
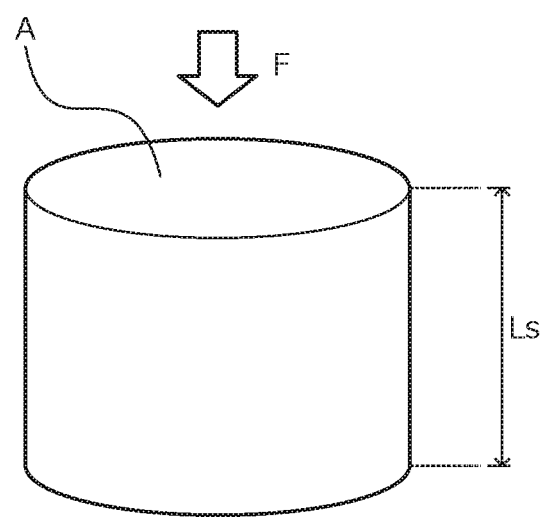
FIG. 15 is a table depicting characteristics of various types of solder materials.
FIG. 16 is a diagram depicting a compression displacement calculation model of an expanding and contracting part.
Figure 17:
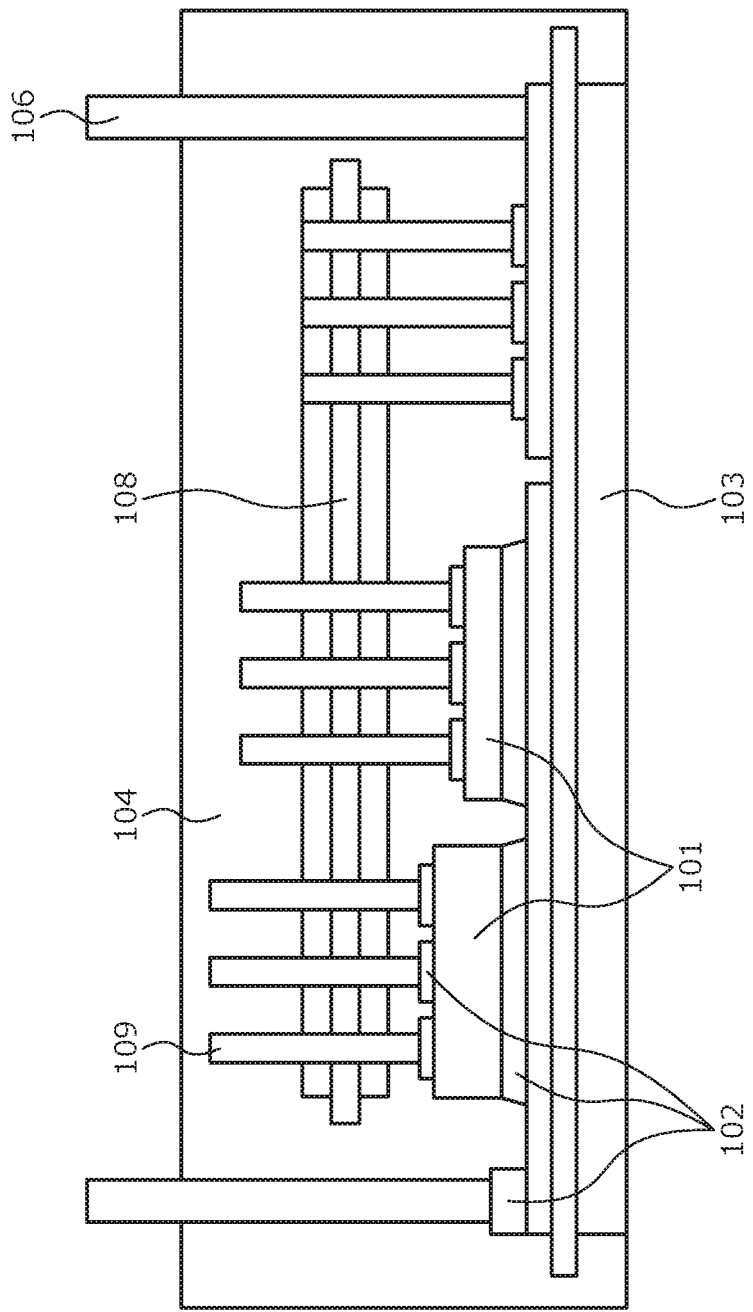
FIG. 17 is a side view of a structure of a power semiconductor module having a conventional molded structure.

FIG. 15 is a table depicting characteristics of various types of solder materials. In FIG. 15, Young's modulus and thermal expansion (CTE) are depicted as solder characteristics. Here, alloy composition is indicated as percent by weight. For example, Sn-57Bi-1Ag indicated in FIG. 15 is an alloy containing Bi at 57% by weight, Ag at 1% by weight, and the remaining being Sn. Young's modulus is a proportionality constant of strain and stress in a coaxial direction in an elastic range; the smaller Young's modulus is, the easier solder shrinks. Thermal expansion and CTE indicate per unit temperature, a rate of length expansion of an object due to temperature.

FIG. 16 is a diagram depicting a compression displacement calculation model of the expanding and contracting portion. Stress σ and displacement amount δ when a load F is applied to the expanding and contracting portion having a cross-sectional area A and a length Ls are expressed by equations (1) and (2). Further, from equations (1) and (2), the stress a of the expanding and contracting portion is derived as equation (3), where E is Young's modulus of the expanding and contracting portion.

$$\sigma = F/A \tag{1}$$

$$\delta = F \times Ls/(E \times A) \tag{2}$$

$$\sigma = \delta \times E/Ls \tag{3}$$

As in the first, fourth, and sixth to eighth embodiments, when the external connection terminal 6 does not have the lower conductive plate 16, the stress of the expanding and contracting portion is transmitted to the insulating substrate 31 through the conductive plate 32. In other words, when the implant pins 91 are bonded to the conductive plate 32 through the bonding member 2 or when the implant pins 91 are directly press-fitted to the conductive plate 32, the stress of the expanding and contracting portion is transmitted to the insulating substrate 31 through the conductive plate 32. Stress σ1 applied to the insulating substrate 31 is mitigated by the conductive plate 32 and, for example, is ½ of the stress σ applied to the expanding and contracting portion. The stress σ1 is expressed by equation (4). Therefore, in this case, Young's modulus E1 of a permissible expanding and contracting portion is expressed by expression (5), which is derived from equation (4).

$$\sigma 1 = \sigma/2 = \delta \times E1/(Ls \times 2) \tag{4}$$

$$E1 \leq \sigma 1 \times Ls \times 2/\delta \tag{5}$$

As in the second, third, and fifth embodiments, when the implant pins 91 or the upper conductive plate 17 are bonded to the conductive plate 32 via the lower conductive plate, stress σ2 applied to the insulating substrate 31 is a value obtained by multiplying the stress σ applied to the expanding and contracting portion and a cross-sectional ratio. This case is expressed as equation (6), where A is the cross-sectional area of the expanding and contracting portion and A1 is the cross-sectional area of the lower conductive plate. Furthermore, Young's modulus E2 of a permissible expanding and contracting portion in this case is expressed by expression (7), which is derived from equation (6).

$$\sigma 2 = \sigma \times A/(2 \times A1) = \delta \times E2 \times A/Ls \times A1 \tag{6}$$

$$E2 \leq \sigma 1 \times Ls \times 2 \times A1/(\delta \times A) \tag{7}$$

To prevent the stacked substrate 3 from being damaged by the stress from the external connection terminal 6 or the implant pins 91, stress E1, E2 applied to the insulating substrate 31 has to be less than a bending strength σf of the stacked substrate 3 and to have a margin in terms of design, may be 90% of the bending strength σf or less. Therefore, Young's moduli E1, E2 of a permissible expanding and contracting portion are expressed by expressions (8) and (9) that are from expressions (5) and (7).

$$E1 \leq 1.8 \times \sigma f \times Ls/\delta \tag{8}$$

$$E2 \leq 1.8 \times \sigma f \times Ls \times A1/(\delta \times A) \tag{9}$$

On the other hand, the load F is large and the heat dissipating plate 33 is strongly pushed against the upper mold 13, whereby warping of the stacked substrate 3 is suppressed and the sealing insulation material 4 may be prevented from entering between the heat dissipating plate 33 and the upper mold 13. For example, the load F necessary for this is a mathematical product of a substrate area A2 and 0.1 MPa. Therefore, Young's modulus E of a permissible expanding and contracting portion is expressed by expression (10) that is from equation (2).

$$E \geq 0.1 \times Ls \times A2/(\delta \times A) \tag{10}$$

Furthermore, the displacement amount δ of the expanding and contracting portion, as indicated by equation (11), is a value obtained by subtracting the height L of the power semiconductor circuit member before molding from a sum of the height L1 of the inner surface of the lower mold 12, the depth L2 of the groove 14 of the lower mold 12, and the height L3 of the inner surface of the upper mold 13, refer to FIG. 5. Therefore, Young's moduli E1, E2 of a permissible expanding and contracting portion are calculated by expressions (12) and (13).

$$\delta = L1 + L2 + L3 - L \quad (11)$$

$$0.1 \times Ls \times A2/[(L1+L2+L3-L) \times A] \leq E1 \leq 1.8 \times \sigma f \times Ls/(L1+L2 \times L2-L) \quad (12)$$

$$0.1 \times Ls \times A2/[(L1+L2+L3-L) \times A] \leq E2 \leq 1.8 \times \sigma f \times Ls \times A1/[(L1+L2+L3-L) \times A] \quad (13)$$

A specific example of a case where the external connection terminal 6 does not have the lower conductive plate 16 as in the first, fourth, and sixth to eighth embodiments will be described, i.e., a case where the implant pins 91 are bonded to the conductive plate 32 via the bonding member 2 or a case where the implant pins 91 are directly press-fitted to the conductive plate 32. For example, for the expanding and contracting portion, the length of the solder of the bonding member 2 is assumed to be 2.0 mm or more, the cross-sectional area of the solder is assumed to be 0.5 mm² or less, the substrate area of the stacked substrate 3 is assumed to be 25 cm², and a value obtained by subtracting the height L of the power semiconductor circuit member before molding from the sum of the depth L2 of the groove and the heights L1, L3 of the inner surfaces of the upper and lower molds is assumed to be 0.05 mm. When the insulating substrate 31 used is made of silicon nitride having the bending strength of=700 MPa, from expression (12), a material for which Young's modulus E1 is 20 GPa or more and 50 GPa or less may be used for the expanding and contracting portion. Further, under the same conditions for the solder of the bonding member 2, the stacked substrate, the mathematical areas, the molds, and the height of the power semiconductor circuit member, when aluminum oxide having the bending strength of=500 MPa is used in the stacked substrate 3, a material for which Young's modulus is 20 GPa or more and 36 GPa or less may be used for the expanding and contracting portion. Further, under the same conditions for the solder of the bonding member 2, the stacked substrate, the mathematical areas, the molds, and the height of the power semiconductor circuit member, when aluminum nitride having the bending strength of=450 MPa is used in the stacked substrate 3, a material for Young's modulus is 20 GPa or more and 32 GPa or less may be used for the expanding and contracting portion.

A specific example of a case where the implant pins 91 or the upper conductive plate 17 is bonded to the conductive plate 32 via the lower conductive plate as in the second, third, and fifth embodiments, for example, will be described. For example, for the expanding and contracting portion, the length of the solder of the bonding member 2 is assumed to be 1.0 mm or more, the cross-sectional area of the solder is assumed to be 1.0 mm² or less, the substrate area of the stacked substrate 3 is assumed to be 25 cm², and a value obtained by subtracting the height L of the power semiconductor circuit member before molding from the sum of the heights L1, L3 of the inner surfaces of the upper and lower molds and the depth L2 of the groove is assumed to be 0.05 mm. Furthermore, the cross-sectional area A1 of the lower conductive plate 16 is assumed to be 4.0 mm². When the insulating substrate 31 used is made of silicon nitride having the bending strength of=700 MPa, from expression (13), a material for which Young's modulus E1 is 10 GPa or more and 100 GPa or less may be used for the expanding and contracting portion. Further, under the same conditions for the solder of the bonding member 2, the stacked substrate, the mathematical areas, the molds, the height of the power semiconductor circuit member, and the cross-sectional area of the lower conductive plate 16, when aluminum oxide having the bending strength of=500 MPa is used in the stacked substrate 3, a material for which Young's modulus is 10 GPa or more and 72 GPa or less may be used for the expanding and contracting portion. Further, under the same conditions for the solder of the bonding member 2, the stacked substrate, the mathematical areas, the molds, and the height of the power semiconductor circuit member, when aluminum nitride having the bending strength of=450 MPa is used in the stacked substrate 3, a material for which Young's modulus is 10 GPa or more and 64 GPa or less may be used for the expanding and contracting portion.

The expanding and contracting portion may be that having thermal expansion (CTE) that is close to the thermal expansion (CTE) of the sealing insulation material 4. Alternatively, the thermal expansion (CTE) is $15 \times 10^{-6}$/K or more and $25 \times 10^{-6}$/K or less. By doing so, stress deformation caused by the sealing insulation material 4 and peeling may be prevented.

The present invention is not limited to the embodiments described and various modifications within a range not departing from the spirit of the invention are possible. For example, dimensions and materials of parts may be variously set according to required specifications.

According to the embodiments of the present invention, the external connection terminal is connected to the conductive plate and is provided erectly from insulating sealing material to the outside. As a result, a semiconductor module having good heat dissipating properties without excess resin at the heat dissipating surface is obtained. Further, warping of the power semiconductor module is suppressed. The external connection terminal further has the buckling portion. As a result, an excessive external load may be absorbed, reducing the stress applied to the stacked substrate (insulating substrate). In this manner, excessive stress applied by the mold during fabrication of the power semiconductor module is absorbed by the external connection terminal. Therefore, the stress applied to the stacked substrate is reduced, enabling damage of the stacked substrate to be prevented.

The semiconductor device and the method of manufacturing a semiconductor device according to the embodiments of the present invention achieve an effect in that stress applied to the insulating substrate is reduced and damage of the insulating substrate may be prevented.

As described, the semiconductor device and the method of manufacturing a semiconductor device according to the embodiments of the present invention are useful for power semiconductor devices used in power converting equipment such as inverters; automotive power control units; and power source devices such in various types of industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a semiconductor element;
   a conductive plate having a front surface on which the semiconductor element is mounted;
   a sealing resin internally encapsulating at least the front surface of the conductive plate and the semiconductor element, the sealing resin being made of a hard resin; and an external connection terminal having two ends, one of which is connected to the conductive plate and the other of which is entirely exposed outside the sealing resin, wherein the external connection terminal has a buckling portion between the two ends, the buckling portion being entirely within the sealing resin for reducing stress to be applied to the conductive plate, the buckling portion having a single buckling point, and being constituted of an upper portion that is one side from the buckling point and a lower portion that is an other side from the buckling point, each of the upper and lower portions having a linear shape, the upper and lower portions forming a V shape, positions of the two ends of the external connection terminal overlapping when viewed from a direction orthogonal to a surface of the conductive plate.

2. A semiconductor device, comprising:

a semiconductor element;

a conductive plate having a front surface on which the semiconductor element is mounted;

a sealing resin internally encapsulating at least the front surface of the conductive plate and the semiconductor element, the sealing resin being made of a single material of a hard resin and being exposed outside the device; and an external connection terminal having two ends, one of which is connected to the conductive plate, and the other of which is entirely exposed outside the sealing resin, wherein the external connection terminal has a buckling portion or an expanding and contracting portion between the two ends, for reducing stress to be applied to the conductive plate, positions of the two ends of the external connection terminal overlapping when viewed from a direction orthogonal to a surface of the conductive plate.

3. The semiconductor device according to claim 1, wherein the buckling portion in the external connection terminal has an internal angle at the buckling point in a range from 120 degrees to 177 degrees.

4. The semiconductor device according to claim 1, wherein the external connection terminal applies pressure to the conductive plate, the pressure being less than 80% of a bending strength of the conductive plate.

5. The semiconductor device according to claim 2, wherein the notch has a V-shaped cut.

6. The semiconductor device according to claim 2, wherein the external connection terminal has a linear shape, and the buckling portion includes a notch formed in the external connection terminal, the notch being a groove, or including a part that has a diameter or width in a direction parallel to the surface of the conductive plate smaller than a diameter or width of the buckling portion.

\* \* \* \* \*